(12) United States Patent
Jackson

(10) Patent No.: US 7,225,819 B2
(45) Date of Patent: Jun. 5, 2007

(54) APPARATUS PROCESS AND METHOD FOR MOUNTING AND TREATING A SUBSTRATE

(76) Inventor: David P Jackson, 22328 Barcotta Dr., Saugus, CA (US) 91350

( * ) Notice: Subject to any disclaimer, the term of this patent is extended or adjusted under 35 U.S.C. 154(b) by 618 days.

(21) Appl. No.: 10/433,833

(22) PCT Filed: Dec. 7, 2001

(86) PCT No.: PCT/US02/24040

§ 371 (c)(1),
(2), (4) Date: Jun. 9, 2003

(87) PCT Pub. No.: WO03/003428

PCT Pub. Date: Jan. 9, 2003

(65) Prior Publication Data

US 2005/0098195 A1    May 12, 2005

(51) Int. Cl.
| | | |
|---|---|---|
| B08B 3/00 | (2006.01) |
| B08B 9/00 | (2006.01) |
| A47L 5/00 | (2006.01) |
| A47L 9/00 | (2006.01) |
| A47L 1/00 | (2006.01) |
| A47L 5/38 | (2006.01) |
| A47L 15/00 | (2006.01) |
| A47L 7/00 | (2006.01) |
| F26B 25/00 | (2006.01) |
| F26B 17/00 | (2006.01) |
| F26B 21/06 | (2006.01) |
| F26B 3/00 | (2006.01) |

(52) U.S. Cl. .................. 134/200; 134/63; 134/137; 134/166 R; 134/167 R; 15/300.1; 15/306.1; 15/301; 15/308; 15/302; 15/303; 15/320; 34/102; 34/576; 34/191; 156/345.1; 156/345.54

(58) Field of Classification Search ............. 134/198, 134/200, 63, 137, 166 R, 167 R; 15/300.1, 15/306.1, 308, 301, 302, 303, 320; 34/102, 34/576, 191; 156/345.1–345.54
See application file for complete search history.

(56) References Cited

U.S. PATENT DOCUMENTS 5,989,355 A * 11/1999 Brandt et al. ................. 134/6
5,996,353 A * 12/1999 Maxwell et al. .............. 62/3.2

* cited by examiner

Primary Examiner—Michael Barr
Assistant Examiner—Rita Ramesh Patel

(57) ABSTRACT

The present invention is a method, apparatus and process for an improved substrate mounting and processing technique for various substrate treatments comprising cleaning, dicing, sawing, polishing, and planarization, among others.

7 Claims, 6 Drawing Sheets

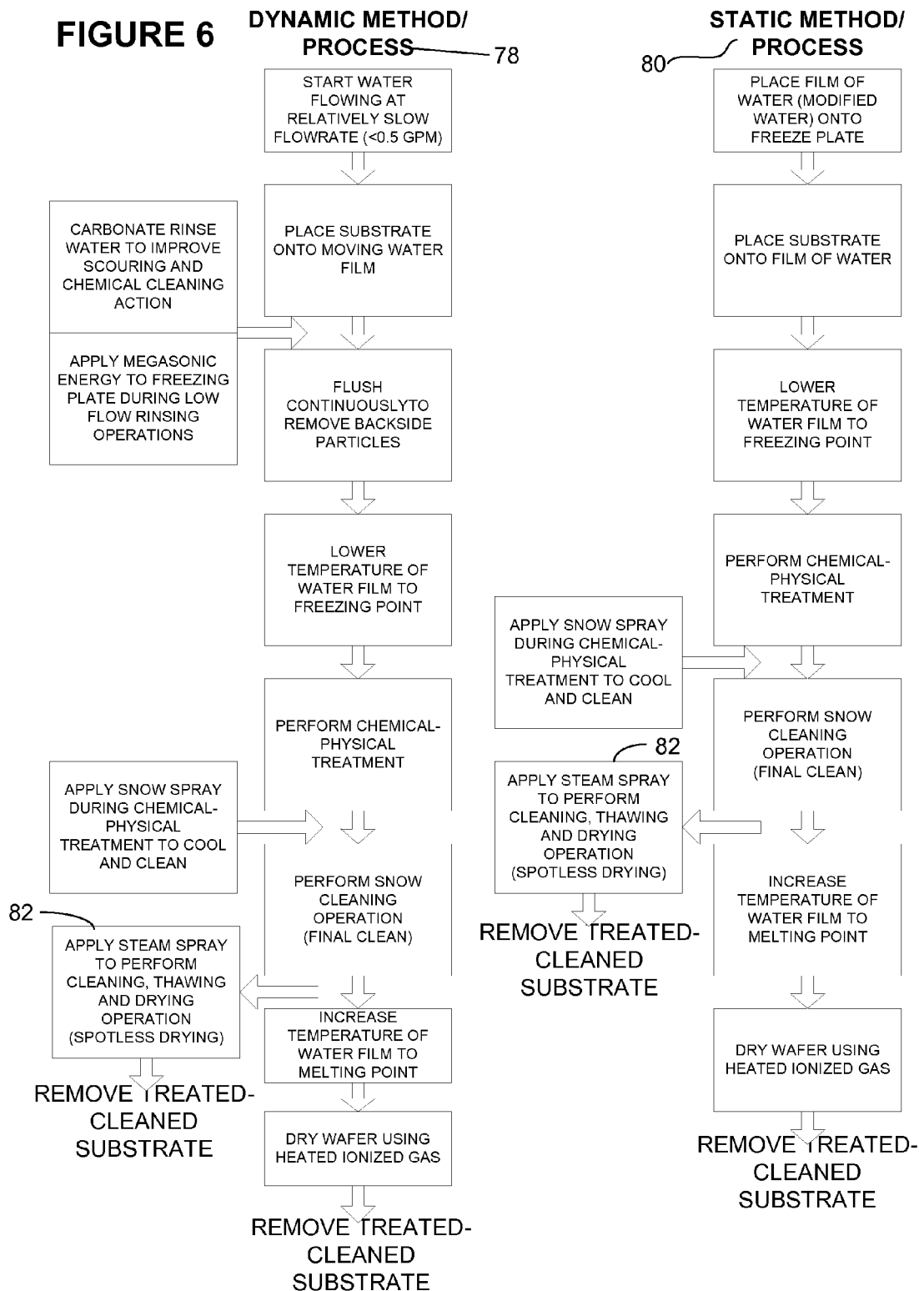

APPARATUS PROCESS AND METHOD FOR MOUNTING AND TREATING A SUBSTRATE

BACKGROUND OF INVENTION

The present invention relates generally to the field of mounting substrates for processing using any variety of chemical-mechanical treatments including, but not limited to, cleaning, sand blasting, milling, machining, drilling, dicing, sawing, polishing, and planarizing, among others. More specifically, the present invention provides methods and apparatuses for mounting and cooling, cleaning and/or lubricating a substrate during a chemical-mechanical treatment using water ice as an instantaneous adhesive in combination with a near-cryogenic or cryogenic impingement cleaning and/or cooling spray.

The microelectronics industry is constantly seeking improved yields in a wide variety of complicated chemical-physical substrate treatment applications. Continuous efforts are being made to improve both processing quality and throughput. Moreover, global environmental imperatives require decreased reliance on organic solvents for cleaning, liquid coolants for machining, and reduced water usage. These trends are accompanied by continuous efforts to further miniaturize substrate sizes in order to maximize the yield. To achieve these goals, it is necessary to develop cleaner and greener mounting, cooling and cleaning techniques. Before discussing the present invention, it is important to discuss and analyze conventional mounting, cooling and processing techniques used within industry.

Substrate Mounting Techniques

Substrates are currently mounted by several mounting methods. In most cases where only a portion (example: topside of substrate) of the substrate material is to be treated, trouble-free processing using any number of techniques is accomplished if the substrate is mounted stiffly to a base and does not move during the chemical-physical treatment process. Acceptable mounting methods may include a vacuum chuck, magnetic clamp, mechanical vise, electrostatic plate, adhesive tape, among other mounting techniques. Processing through the substrate material or handling very small and complexly shaped substrates, however, is very different and creates both mounting and quality problems during a chemical-physical treatment. For example in dicing, the smaller the dies, the more difficult and critical is the mounting technique used. Almost any cut-through operation will require an optimized mounting technique. The following is a discussion of the different mounting techniques and parameters used in industry for this particular industry chemical-physical treatment.

Tape Mounting

This is the most common mounting method used in dicing microelectronic substrates. It is used mainly because of its easy handling and the fact that it is a mounting media for the dicing process and later on for the die bonding process. The most common tape is a PVC tape 0.003" (0.076 mm) thick that is available with different adhesive tackiness characteristics. The mounting is carried out either manually or with wafer mounting systems. The mounting goal is to have a good, uniform contact between the substrate and the tape without any air bubbles, dust or dirt particles between the substrate and the tape. The tape is then mounted to a frame of different designs, depending on the saw type. The frame is a stiff handling media for easy handling to the saw, on the saw and outside of the saw to the die bonding process.

Main problems and process optimization when dicing through into tapes:

1) Most tapes are made of soft PVC with a thin layer of adhesive.

The PVC tape by nature is soft and overloads any dicing blade. Blade overloading means blade clogging, and therefore high temperatures that cause material damage mainly at the backside of the substrate.

Wax, Glue and Pitch Mounting

Waxing, gluing or pitch-blocking the substrate to a solid media is, in most cases, superior to tape mounting techniques for the following reasons:

1. Improved clamping characteristics compared to tape mounting. This is a major advantage when processing small substrates.
2. The ability to dice much deeper into the base media results in much better quality mainly on the backside of the substrate.
3. A firm mounting eliminates any die movement—improving the cut quality.
4. Soft or hard base media can be chosen in order to control the blade wear and to act as a cleaning (dressing) media for the blade.
5. Substrates that are not perfectly flat can be mounted with wax or glue. The wax/glue compensates by filling in gaps.

Main disadvantage and points to be optimized:

1. Some waxes have relatively higher melting points which may damage the die components.
2. Handling is the main disadvantage of wax, glue and pitch-block mounting over tape mounting. Hot plates must be used for the wax mounting and organic solvents and other hazardous chemicals to dissolve the wax or glue.
3. Following gross removal using a hot plate, the final cleaning of the dies is also time consuming a major disadvantage over tape mounting and further requires the use of cleaning solvents to remove residual mounting agents.

Mechanical Mounting

Mechanical clamping is preferable on some applications for the following reasons:

1. Easy handling.
2. Fast loading and unloading for high volume production.
3. The geometry of the substrate is such that only specially designed mechanical clamping can actually be used.

The main drawbacks for mechanical mounting techniques are as follows:

1. Difficult to mechanically clamp a very small or complex substrate.
2. Direct mechanical clamping may damage some sensitive substrates.

Substrate Cooling and Lubrication

In many chemical-physical treatments such as drilling, milling, sawing and dicing, among others, coolant and lubrication is typically required for the treatment tool (i.e., blade, drill bit, honing bit, buffing pad). Most often coolant is provided in the form of chilled water, water-oil mixtures or machining oils. For example, cooling the blade and the substrate is a requirement for most dicing applications. The following are the main goals when using a coolant during any dicing application:

1. To cool the blade edge and the substrate material.
2. The coolant acts as a lubricant to minimize friction between the blade and the substrate material.
3. The coolant helps to wash out the powder residue from the dicing process.

In the past, most applications were cooled with a standard cooling nozzle. The idea was to shoot the coolant at the contact point of the blade with the substrate. The pressure, in most cases, was the highest possible on the saw. Today, there are many new types of applications that require unique cooling systems in order to meet special quality control requirements.

Dicing thick substrates of over 100" (2.5 mm) creates quality problems related to the cooling process. The main problem with thick substrates is cooling the bottom of the cut.

Two options are available to overcome this cooling problem on thick substrates:

1. Adding 2–5% of an organic macromolecule additive to the coolant water lowers the surface tension of the water and helps the coolant to penetrate better to the full depth of the kerf. The coolant also acts as a lubricant, which helps minimize the load during the dicing process. Among the organic additives available are biodegradable solutions or what are called "green" solutions for the environment. The additives can be added as a mist to the coolant line or mixed with the water in a closed loop system.

2. Another way of getting the coolant to the bottom of a deep cut is by using a cooling flange set. This unique design spreads the coolant from the center of the flange to the outer edge of the blade on both sides. The high velocity (spindle r.p.m.) translates into high pressure on the coolant, which is forced to the bottom of the cut.

For some brittle materials that tend to chip during the dicing, a closed coolant system may be used to reduce the water temperature to as low as 10 C. This has been found to reduce chipping.

Ice Mounting

Water ice as a mounting media is attractive since tap water ice has an adhesion strength of approximately 300 psi—more than enough holding power for most chemical-physical treatments. A process and apparatus using water ice as a fixturing technique was commercialized by Audemars Piguet, Clearwater, Fla., in the early 1990's. The Audemar's product was called the Ice-Plate System, which used a recirculating coolant system to either cool down or heat up a topside copper plate. The copper plate was coated with a water film, a substrate was placed onto the film, and the freeze plate was chilled using a cold coolant flowing through the copper plate. Following processing, a thermalant was pumped through the freeze plate to thaw the water ice thereon. It is believed that the commercial machine and process offered had its origins and use primarily in Swiss precision watch assembly operations. Although the commercial device was offered as a mounting technique for holding substrates for a machining operation, the Audemars system did not receive widespread acceptance, and is believed to be no longer offered commercially in the United States. It is believed that the main limitation with the product as it was designed was that it could not be used with many chemical-physical treatments primarily due to heat loads generated by the substrate treatment process, thus causing the substrate to be released from the freezing plate. Other much smaller commercial freezing plates are available in the market from a number of sources. One such source is FerroTec, Nashua, N.H., which offers commercial thermal electric cold plates for use primarily as heat exchangers. Other commercial sources offer small microscope mountable cold plates designed to freeze small samples of tissue for micro-slicing operations with the aid of a microscope. However, these devices are not designed to be used for processing industrial substrates requiring more rigorous treatments as cited herein.

Heretofore, water ice mounting technology has not been effectively applied nor developed adequately to meet the needs of a variety of chemical-physical substrate treatment processes. This technology has not been successfully applied to resolve mounting and treatment operational problems specific to many industrial processes, as cited above with the dicing issues—these being process heat loads, substrate cleanup during processing, substrate cooling during processing, and substrate cleaning and drying following processing.

As such, an improved water ice freezing apparatus and technique for mounting and processing a substrate is extremely attractive for the performance and environmental issues within industry as discussed above. From the above, it is seen that a method and apparatus for fixturing, impingement cleaning, and cooling of precision substrates during dicing, sawing, polishing, cleaning, and planarization, among other surface treatments that provides improved performance and versatility is desired and which overcomes the limitations of conventional technology cited above.

SUMMARY OF THE PRESENT INVENTION

The present invention provides a safe, efficient, and highly selective method and apparatus to mount, cool, lubricate and clean a substrate being subjected to a chemical-physical treatment process. Substrate treatment processes may include one, or a combination of the following: near-cryogenic and cryogenic impingement spray cleaning treatments such as LN2 spray, $CO_2$ snow-gas cleaning, Argon Ice cleaning, microabrasive finishing, drilling, machining, milling, polishing, cutting, dicing, planarization, and micro-assembly operations, among others.

In a first embodiment of the present invention, a substrate to be treated is placed onto a base substrate containing on its surface a thin film of liquid water, which may contain one or more additives described herein. Following this, the liquid water film located between the base substrate and substrate to be treated is chilled to its solidification point using an exemplary thermal electric thermal pump connected to said base substrate. At this point, the substrate is adhesively bonded and electrically joined to the base substrate using water ice which may contain additives to alter the physicochemistry of the water ice formed. The mounted substrate may be treated using any number of chemical-physical processes so long as the selected treatment process does not cause the substrate to extract heat from the bondline in excess of the heat extraction provided by the Peltier device connected to the base substrate. During treatment, the substrate is spray cleaned with a cryogenic or near-cryogenic spray such as LN2, Argon Ice, cold gas, and solid carbon dioxide to provide both cooling and cleaning action. Following treatment, the current flow through the exemplary thermal electric device is reversed causing the water ice adhesive to be heated, thus changing from solid state to liquid state—releasing the treated substrate from base substrate. Continued heating by the thermal electric device dries the substrate completely.

As such, the first embodiment of the present invention provides the following unique combination of characteristics and advantages over existing technology cited above:

1. A novel mounting apparatus that uses a thermal electric device with reversible current flow to change a thin film of water or water mixture from a "liquid state" to a "solid state" to form in-situ, a strong adhesive bond which is thermally and electrically conductive. Reversing the current of the exemplary thermal electric device is used to destroy the adhesive bond and ultimately dry the substrate. There is no need for separate cooling, heating and drying systems.

2. Water ice mounting provides superior bottom side cooling which improves the performance of applications such as dicing through a substrate described herein. This method of mounting provides coolant continuously at the backside of the substrate during treatment (i.e., cutting).

3. Water ice mounting is a cleaner and greener mounting process eliminating the need for post mounting cleanup. No hazardous wastes in the form of spent coolants and oils is produced.

4. The water ice adhesive forms a uniform and conforming bond line and joint which supports the substrate being treated equally along all dimensions without air gaps provides stability. Regardless of the shape, geometry and complexity of the bottomside of a substrate, water flows around and grips all of the underside surfaces during solidification.

5. The water ice adhesive is electrically conductive and safely drains away electrostatic charges created during various substrate treatments. This is a unique method of electrically shunting a substrate from below during surface treatments which generate harmful electrostatic charges. Ice shunting the substrate eliminates or controls ESD by draining electrical charges from the treated substrate conductively to a base substrate and to earth ground.

6. Water ice adhesive may be modified with various additives which engineer the structure and mechanical properties of the water ice adhesive. These may include increasing tensile strength, lowering thermal conductivity, increasing electrical conductivity, lowering surface tension among other properties. For example, adding a small amount (1–5%) of wood particles will increase the shock resistance of water ice to that of concrete.

7. The application of a cryogenic or near-cryogenic cleaning spray, including sublimable solids and cold gases, to an ice-fixtured substrate provides two important functions as follows: a) the cryogenic or near-cryogenic sprays cool surfaces which prevents the water ice adhesive from melting and b) cryogenic or near-cryogenic sprays clean surfaces flushing away surface debris and particles. As such the cleaning-cooling-spray may be used before, during or following surface treatments as cleaning and cooling treatments. Following application, the spray cleaning-cooling agent evaporates or sublimates, leaving no residual cooling or cleaning agent to manage.

In a second embodiment of the present invention, a substrate to be treated is placed onto a base substrate containing on its surface a thin film of liquid water, which may contain one or more additives described herein. Following this, the liquid water film located between the base substrate and substrate to be treated is chilled to its solidification point using an exemplary thermal electric thermal pump connected to said base substrate. At this point, the substrate is adhesively bonded to the base substrate using water ice and additives, if desired. Following this, a dicing blade may be used to dice the substrate into variously sized dies, during which, a $CO_2$ snow spray is directed at the contact point to provide simultaneous cooling and cleaning during dicing. Moreover, the $CO_2$ snow may be combined with a water mist using the exemplary snow cleaning device herein to provide enhanced lubricity and cutting using said water-carbon dioxide solid-liquid coolant mixture. This same embodiment may be used for microabrasive finishing, drilling, machining, polishing, grinding, planarization, among many of chemical-physical treatments. Following treatment, the current flow through the exemplary thermal electric device is reversed causing the water ice adhesive to be heated, thus changing the mounting agent from solid state to liquid state—releasing the treated substrate from base substrate. Continued heating will dry the substrate.

In a third embodiment of the present invention, a substrate to be treated is placed onto a base substrate containing on its surface a thin film of liquid water, which may contain one or more additives described herein. Following this, the liquid water film located between the base substrate and substrate to be treated is chilled to its solidification point using an exemplary thermal electric thermal pump connected to said base substrate. At this point, the substrate is adhesively bonded to the base substrate using water ice and additives, if desired. Following this, a cryogenic or near-cryogenic spray cleaning stream is directed at the substrate. The low temperature of the cleaning spray allows for the temporary deactivation of the thermal electric device during treatment. Following spray cleaning treatment, the current flow through the exemplary thermal electric device is reversed causing the water ice adhesive to be heated, thus changing the mounting agent from solid state to liquid state—releasing the treated substrate from base substrate. Continued heating will eventually dry the substrate.

In a fourth embodiment of the present invention, a substrate to be treated is placed onto a base substrate containing on its surface a thin film of liquid water, which may contain one or more additives described herein. Following this, the liquid water film located between the base substrate and substrate to be treated is chilled to its solidification point using an exemplary thermal electric thermal pump connected to said base substrate. At this point, the substrate is adhesively bonded to the base substrate using water ice and additives, if desired. Following this, an exemplary cryogenic or near-cryogenic spray stream is directed at the substrate during which a selected treatment such as milling is performed on the substrate. The spray stream is directed at the selected treatment tool (i.e., drill bit) and substrate contact point simultaneously so as to provide cooling and cleaning during the selected surface treatment process. As in the third embodiment, the low temperature of the cleaning spray allows for the temporary deactivation of the thermal electric device during treatment. Following an optional final spray cleaning treatment using the exemplary $CO_2$ snow spray, the current flow through the exemplary thermal electric device is reversed causing the water ice adhesive to be heated, thus changing the mounting agent from solid state to liquid state—releasing the treated substrate from base substrate. Continued heating will dry the substrate. Alternatively, dry steam may be used to de-ice the substrate following processing, providing simultaneous cleaning, thawing and spotless drying action.

In a fifth embodiment of the present invention, an exemplary apparatus and process for fixturing and treating a semiconductor wafer is taught. The exemplary apparatus and process is capable of mounting and cleaning the backside of a semiconductor wafer prior to mounting and processing. This is performed by using the mounting agent in its liquid state, with additives such as scrubbing gas bubbles and acoustic bubbles, prior to solidification and mounting.

In a sixth embodiment of the present invention, various additives are added to said mounting agent (liquid water) for use in subsequent mounting operations. Additives include solids, liquids and gases and are used to alter the physicochemistry of water to provide enhanced conductivity, thermal insulation, tensile strength, among other properties.

A further understanding of the nature and advantages of the invention may be realized by reference to the latter portions of the specification and attached drawings.

BRIEF DESCRIPTION OF THE DRAWINGS

These and other objects and advantages of the present invention will be obvious to those of ordinary skill in the art after having read the following detailed description of the various embodiments which are illustrated in the various figures.

FIG. 6 gives a flowchart of the exemplary methods and processes used in the present invention using the exemplary apparatus of FIG. 2.

DETAILED DESCRIPTION OF THE INVENTION

Figure 1:
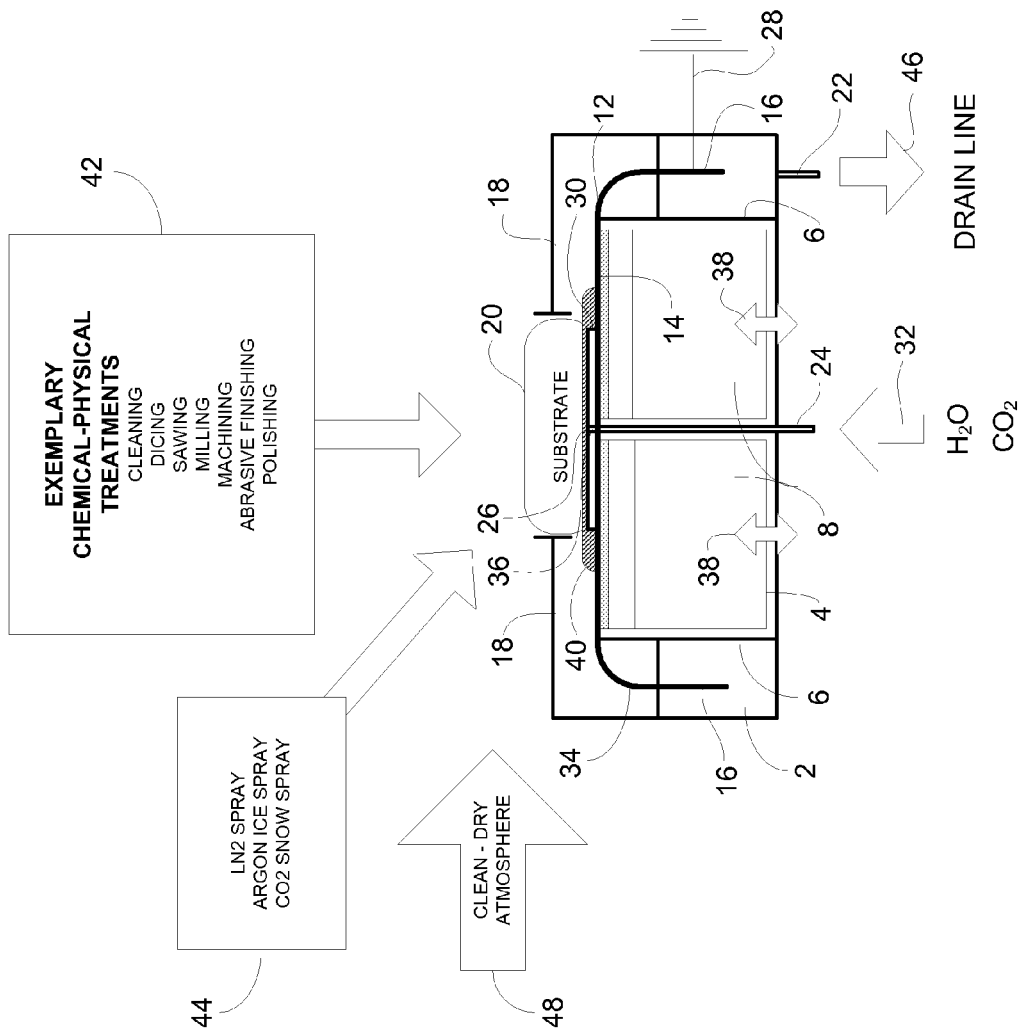
FIG. 1 is an exemplary water ice mounting apparatus for treating a substrate using any number of chemical-physical substrate treatments.

FIG. 1 is an exemplary side view of a general purpose water ice mounting apparatus for treating a substrate using any number of chemical-physical substrate treatments discussed herein. Referring to FIG. 1, the exemplary mounting apparatus comprises two compartments: an outer process fluids drain compartment (2) which surrounds or contains an inner freeze plate compartment (4). The outer compartment (2) is separated from the inner compartment (4) using a suitable isolation wall (6). Within the freeze plate compartment (4) are any number of thermal electric cold plates (8) which have a current-reversible cold and hot side (10). Thermal electric cold plates are available from sources cited above. A suitable thermally conductive base substrate (12) sits on top of the cold plates (8), located centrally within and overlapping (16) and spilling into the drain compartment (2), and is connected thermally using a suitable thermally conductive grease (14). The base substrate may be constructed using any number of thermally conductive materials including aluminum, copper and stainless steel, among others. The exemplary mounting device may have adjustable positioning guides (18) which serve to guide and contain the exemplary substrate (20) to be placed on the base substrate (12). The drain compartment has a drain port (22) to drain to a suitable reservoir thawed water ice and residues. A central pipe (24) is plumbed and sealed into the center (26) of the base substrate (12) and delivers process fluids including water, modified water, and cleaning, displacement and drying gases and ions to the top surface of the base substrate (12) and bottom side of the exemplary substrate (20). The exemplary base substrate (12) is resistively grounded (28) to earth ground through a suitable resistor to safely drain away electrostatic charges generated at the substrate (20) during various treatments.

In operation, a substrate (20) is placed onto the exemplary base substrate (12). Optionally, the substrate may be placed on or within a sacrificial or containment boat (30), respectively. The boat (30) may be designed to be destroyed during a treatment, for example, dicing through operations. Alternatively, the boat (30) may be designed for any number of reuses to capture and contain a very irregularly shaped bottomside surface in a pool of liquid water and subsequently water ice. Following which, water or water containing additives (modified water) is pumped from a reservoir (32) and into the process fluid pipe (24), which flows upward toward the surface of the base substrate (12), or into boat (30). The water flows between the bottomside surface of the substrate (20) and the base substrate (12) or boat (30) and outwardly toward the curved edges (34) which form a spillway for the base substrate (12). The substrate may tend to lift and slide during the above operation, as such the exemplary guides (18) maintain the substrate (20) positioned over the process fluid outlet (36). The exemplary thermal electric cold plates (8) are activated with a DC current flow which causes heat to be drawn from the base substrate (12) and pumped to the ambient environment as shown by the arrows (38) using a suitable heat exchanger contained therein (not shown). The water flow is slowly stopped and the water trapped between the substrate (20) and boat (30) and base substrate (12) rapidly changes state from liquid state to solid state—adhering the substrate (20) and boat (30), if present, to the base substrate (12). This forms a uniform 3-dimensional sheet of water ice adhesive (40) that conforms to the contour and geometry of the bottomside of the substrate (20).

Following this operation, the substrate (20) may be treated with any number of chemical-physical treatment (42) as shown in the figure. It is very advantageous and novel to employ a cryogenic or near-cryogenic spray (44) such as solid carbon dioxide to provide process cooling, cleaning and flushing action to the substrate-tool interface during application. Examples include drilling, cutting, grinding, polishing, planarizing, dicing, among many others. The use of conventional cooling agents such as chilled water, oil-water coolants that operate at temperatures above the ice freezing temperature will cause the ice sheet (40) to melt at the substrate-ice contact interface, which will prematurely release the substrate during treatment. Moreover, sub-cooled coolants such as glycol mixtures must be filtered, recycled or disposed of as a industrial waste and will contaminate the water ice fixture and topside process fluids as well. This is not the case when using a dry cryogenic spray, which sublimates during and following contact cooling and cleaning actions.

Following treatment operations, a final cleaning operation may be performed using the exemplary snow spray (44). This will remove residual treatment by-products such as grinding dusts, drilling chips, dicing powders, among other contaminants from the substrate (20) and surrounding and exposed surfaces of the base substrate (12).

While still adhered to the base substrate (12), the substrate (20) surface may tested or inspected using any number of surface inspection techniques. For example, the surface may be scanned for trace contaminants or changes to surface morphology using Optically Stimulated Electron Emission (OSEE) Spectroscopy, inspected for machining defects using a surface profilometer or optically inspected using a photoimaging system.

Following the optional final cleaning operation, the current flow to the exemplary thermal electric cold plates (8) is reversed from the initial direction, causing heat to be pumped into the base substrate (12) and into the optional boat (30) and water ice sheet (40) as shown graphically in the heat flow arrows (38). This rapidly thaws the ice sheet at the bas substrate contact point, following which heated ionized and filtered gas is flowed through the process fluid line (24) and into the substrate-base substrate interface—displacing the water and residual ice contained therein. The substrate (20) may tend to lift and slide during the above operation, as such the exemplary guides (18) maintain the substrate (20) positioned over the process fluid outlet (36) during thermal ionized gas drying operations. Residual water and ice flows into the collection compartment (2) and drains through the drain line (22) to an appropriate wastewater reservoir (46). The gas drying and ionizing operation continues until the entire substrate is dried as desired. Moreover, the entire operation may be bathed or contained in a localized or compartmentalized environment containing dry clean atmosphere (48) such as HEPA filtered dry nitrogen, CDA or carbon dioxide.

Figure 2:
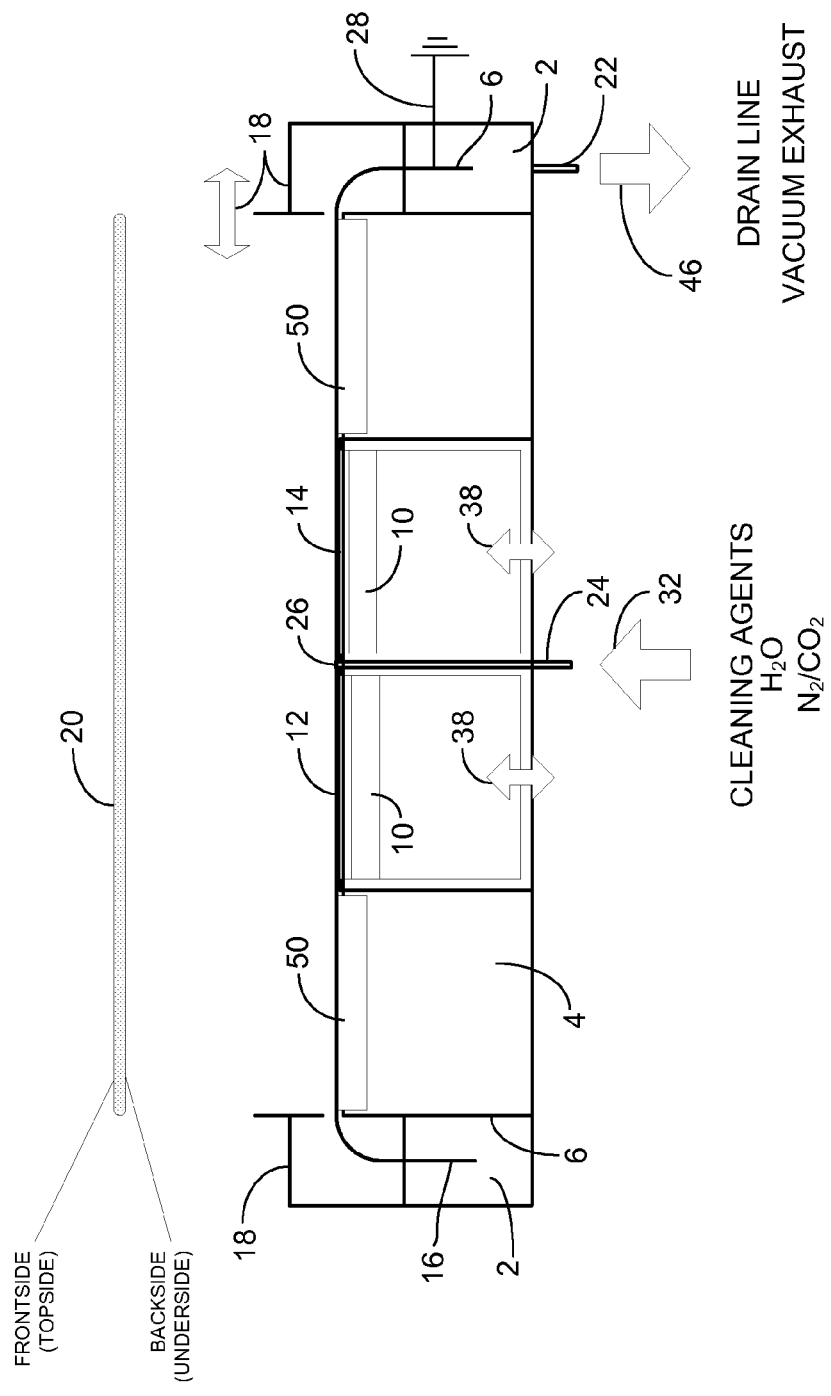
FIG. 2 is an exemplary side view of water ice mounting and cleaning apparatus for processing both sides of a semiconductor wafer.

FIG. 2 is an exemplary side view of water ice mounting and cleaning apparatus for processing both sides of a semiconductor wafer. Referring to the figure, and similar to the exemplary mounting and processing apparatus of FIG. 1 above, the exemplary mounting apparatus comprises two compartments: an outer process fluids drain compartment (2) which surrounds or contains an inner freeze plate compartment (4). The outer compartment (2) is separated from the inner compartment (4) using a suitable isolation wall (6). Within the freeze plate compartment (4) are any number of thermal electric cold plates (8) which have a current-reversible cold and hot side (10). Thermal electric cold plates are available from sources cited above. A suitable thermally conductive base substrate (12) sits on top of the cold plates (8), located centrally within and overlapping (16) and spilling into the drain compartment (2), and is connected thermally using a suitable thermally conductive grease (14). The base substrate (12) may be constructed using any number of thermally conductive materials including aluminum, copper and stainless steel, among others. The exemplary mounting device may have adjustable positioning guides (18) which serve to guide and contain the exemplary substrate (20), for example a semiconductor wafer, to be placed on the base substrate (12). The drain compartment has a drain port (22) to drain to a suitable reservoir thawed water ice and residues. A central pipe (24) is plumbed and sealed into the center (26) of the base substrate (12) and delivers process fluids including water, modified water, and cleaning, displacement and drying gases and ions to the top surface of the base substrate (12) and bottom side of the exemplary substrate (20). The exemplary base substrate (12) is resistively grounded (28) to earth ground through a suitable resistor to safely drain away electrostatic charges generated at the substrate (20) during various treatments.

Also shown in the exemplary device are optional acoustic transducers (50) which are used to generate acoustic cavitation bubbles during pre-cleaning operations of the present invention and discussed below. As with the exemplary device described in FIG. 1, the present device contains a reservoir supply (32) of process fluids including water, modified water, and drying and ionizing gases and a reservoir (46) for collecting and treating wastewater and residues.

Figure 3:
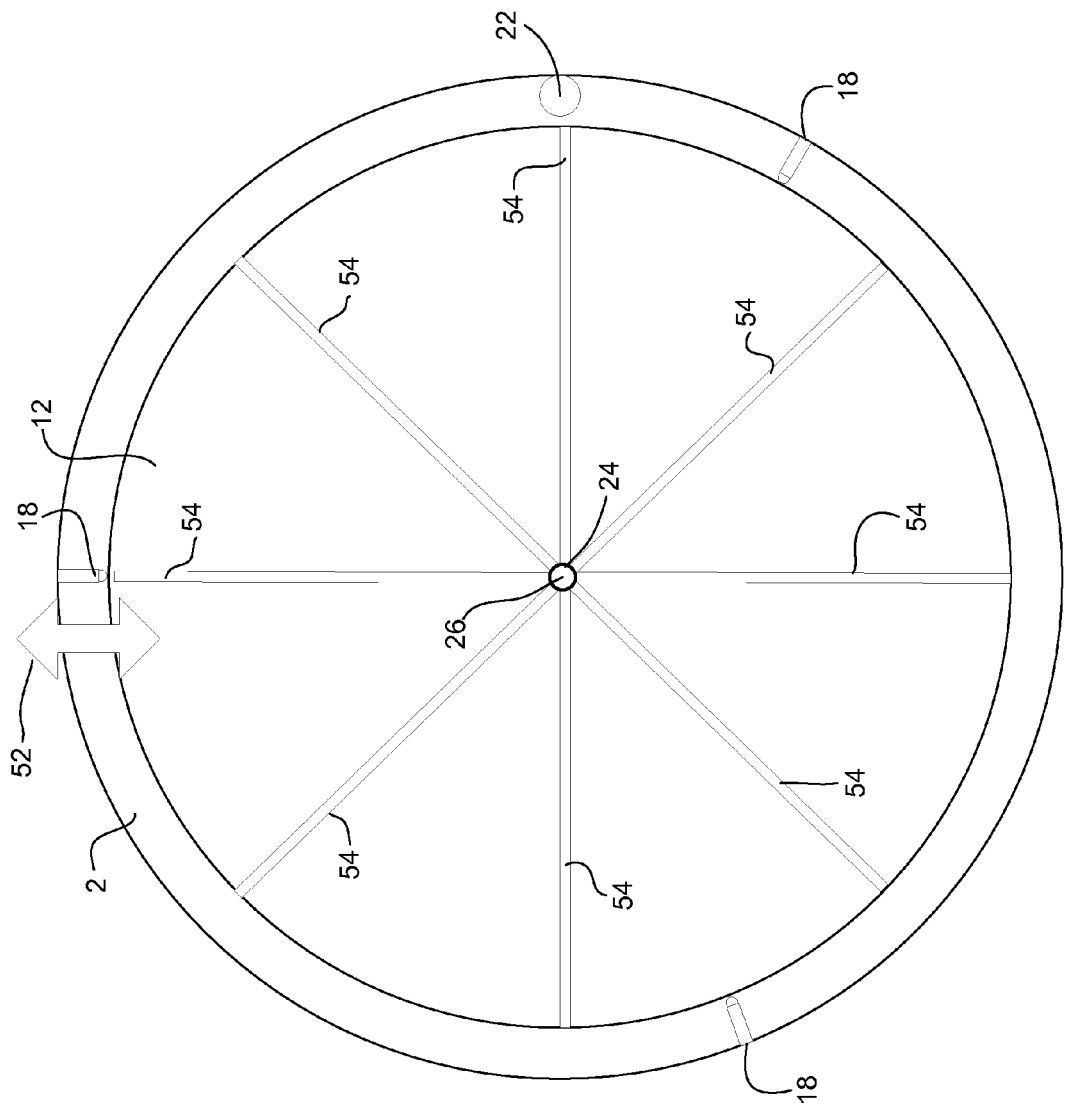
FIG. 3 is an exemplary top view of the apparatus described in FIG. 2 for processing both sides of a semiconductor wafer.

FIG. 3 is an exemplary top view of the apparatus described in FIG. 2 for processing both sides of a semiconductor wafer. Shown in the figure is the centrally located outlet (26) for the exemplary fluids pipe (24) and the exemplary drain line (22). Also shown are alignment posts (18) located at the periphery of the drain compartment (2) equidistant about the circumference of the drain compartment. The alignment guides (18) are adjustable (52) to be any distance around a substrate to capture and align the substrate within the center of the base substrate (12). Another and optional feature on the topside surface of the base substrate (12) are radial vanes or trenches (54). Radial vanes (54) can be of any number and spaced as desired to provide consistent flow paths for the water flowing underneath the substrate. These may be desired if the substrate must not be lifted. The presence of these shallow vanes or trenches, having depths of less than 1 mm, increase the shear stress of the adhesive bond by providing anchors of ice down below the surface of the base substrate (12)—increasing surface area at the base substrate. This would be beneficial in applications involving very aggressive topside treatments such as polishing and planarization, which produce very high shear stress.

Figure 4:
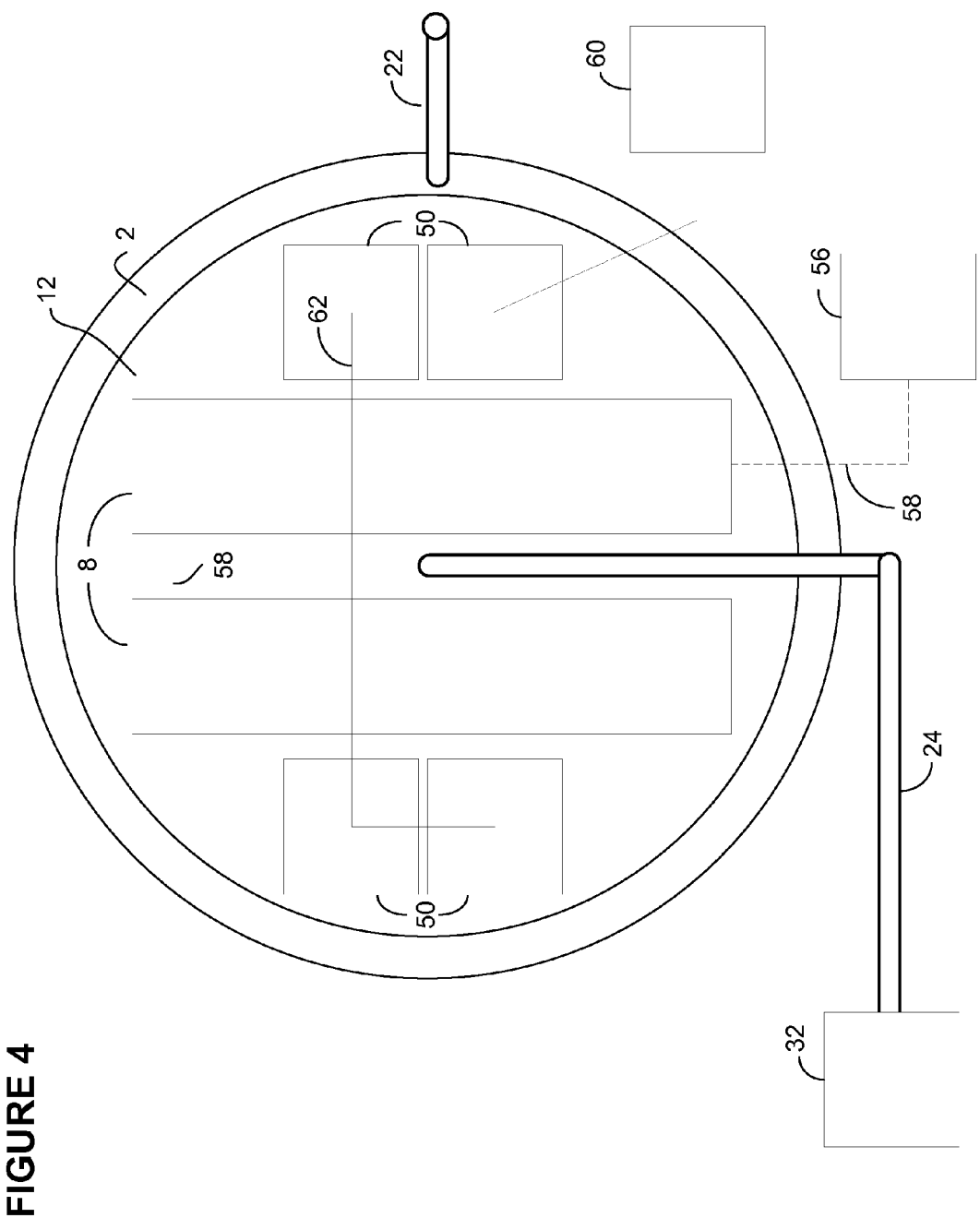
FIG. 4 is an exemplary bottom view of the apparatus described in FIG. 2 for processing both sides of a semiconductor wafer.

FIG. 4 is an exemplary bottom view of the apparatus described in FIG. 2 for processing both sides of a semiconductor wafer. Shown in the bottom view are the exemplary thermal electric cooling plates (8) and optional acoustic transducers (50). The cooling plates (8) are connected from a temperature controller (56) and control wiring (58) which switches DC polarity to the thermal electric devices to provide bidirectional heat flow as described herein. The exemplary and optional acoustic transducers (50) may be of any variety of bondable or weldable type with frequencies of between 20 KHz and 500 MHz or more, and applied power of between 100 to 500 watts, to create and transmit acoustic energy through the base substrate (12) and into the water flowing beneath the substrate on the surface (both not shown) to create cleaning cavitation bubbles or shearing streams therein. The exemplary acoustic devices are controlled with a power supply (60) and interconnecting power lines (62).

Figure 5:
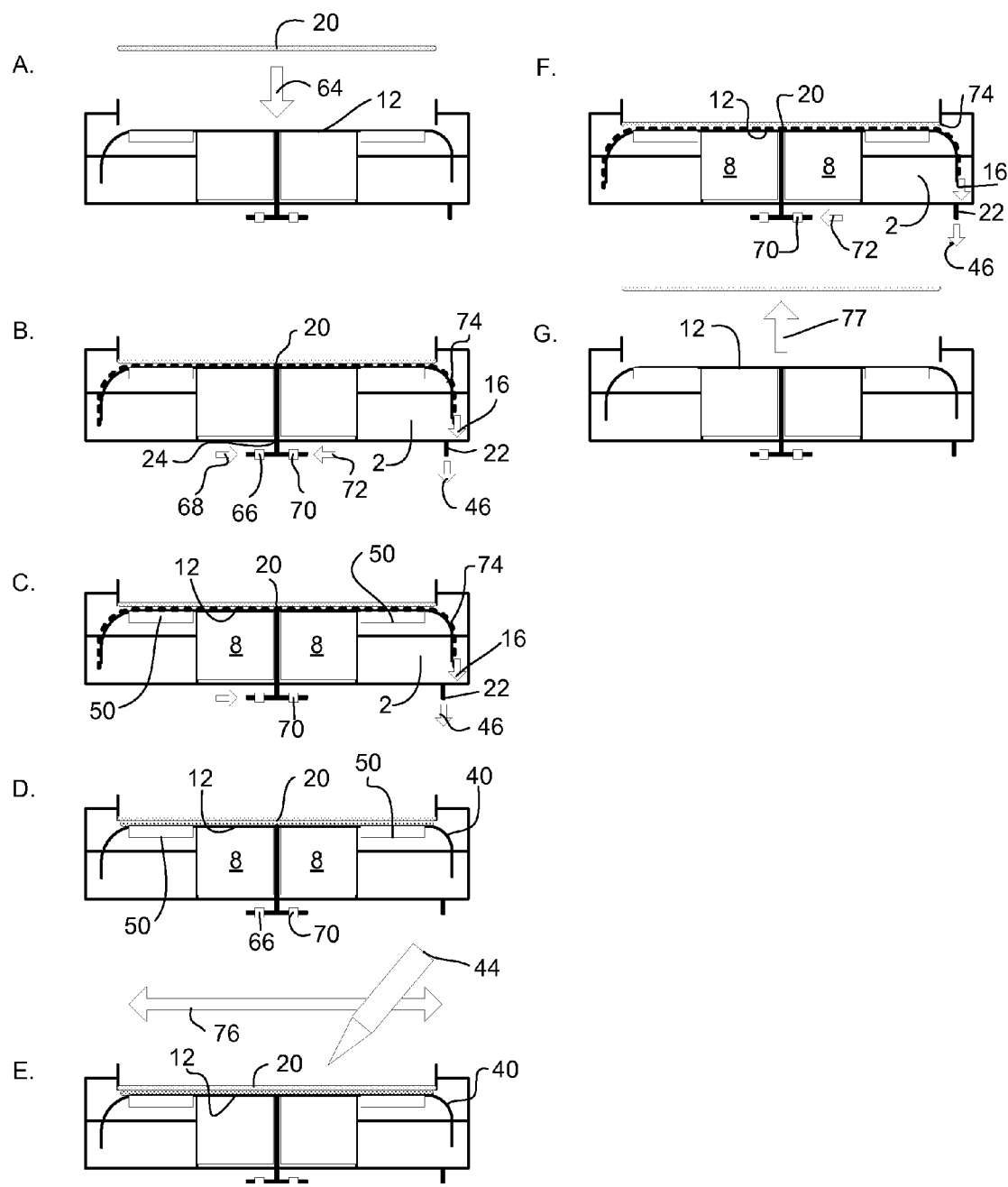
FIG. 5A through G is a schematic of the process steps using the exemplary mounting and cleaning apparatus described in FIG. 2.

FIGS. 5A–G is a schematic of the exemplary process steps using the exemplary mounting and processing apparatus shown and described in FIG. 2 above. Referring to the FIG. 5A, a substrate (20), in this case a semiconductor wafer, is lowered (64) onto the surface of the base substrate (12). Referring to FIG. 5B, a water valve (66) is opened providing a supply of temperature and pressure regulated and filtered deionized water from a reservoir (68) and a gas valve (70) is opened providing a supply of pressure and temperature regulated and filtered carbon dioxide gas from a reservoir (72). The carbonated water mixture flows up through fluid delivery pipe (24) and over the surface of the base substrate (12) underneath (74) the substrate (20), over the edge of the base substrate (16), into the drain compartment (2), through the drain line (22), and into a waste collection reservoir (46). The gas-liquid mixture produces scouring bubbles and a lower cleaning pH (carbonic acid) which enhances the underside cleaning process. This may proceed for a time predetermined to adequately pre-clean the underside of the substrate. Referring to FIG. 5C, the gas valve (70) is shut off and the acoustic transducers (50) are activated, providing acoustic shearing action within the fluid (74) flowing underneath the substrate (20), over the edge of the base substrate (16), into the drain compartment (2), through the drain line (22), and into a waste collection reservoir (46). The thermal electric coolers may be activated so that heat may be generated at the base substrate (12), heating the water flowing underneath the substrate (20). Referring to FIG. 5D, the water supply valve (66), gas supply valve (70) and acoustic transducers (50) are deactivated while the thermal electric coolers (8) have been activated to extract heat from the base substrate (12), forming a sheet of solid adhesive water ice (40) between the substrate (20) and base substrate (12). Referring to FIG. 5E, and with the substrate (20) mounted to the base substrate (12) with a sheet of water ice or modified ice (40), an exemplary near-cryogenic treatment spray (44) is scanned (76) across the substrate (20) as required to clean the surface of said substrate (20). Referring to FIG. 5F, following surface treatment operations, the thermal electric coolers are activated to provide heat to the base substrate (12) partially melting the bonding ice. With this operation, gas valve (70) is actuated (opened) allowing heated, ionized and filtered gas (72) to flow underneath the substrate (20) pushing excess water from beneath the interface, to the overflow (16), into the drain compartment (2), into the drain line (22) and into the waste collection reservoir (46). This operation continues until the substrate (20) is dried and deionized as desired, following which gas valve (70) is closed. Finally and referring to FIG. 5G, the processed substrate (20) is lifted (77) from the base substrate (12).

FIG. 6 gives a flowchart of the exemplary methods and processes used in the present invention using the exemplary apparatuses shown in FIG. 1 and FIG. 2 and as described herein. Referring to FIG. 6, the mounting techniques taught herein may be classified as either a dynamic mounting (78) or static mounting (80) methods and processes. In a dynamic method, the process fluids flow continuously underneath the substrate prior to, during and following placement and treatment. In a static method, the water ice is created from a pre-determined quantity of liquid water placed prior to placement of the substrate and subsequent freezing, processing and thawing operations. An additional embodiment shown in the figure is a dry steam (82) processing step, which may be used as a final clean and drying operation to clean, thaw and dry the substrate treated.

Finally, the mounting agent (water) used to produce an instantaneous adhesive for use in the present invention may be mixed with additives such as silica particles, polymer particles, metallic particles and other solid, liquid and gaseous substances which serve as structural and chemical enhancements prior to or following solidification. For example, it is well known that like concrete, adding certain solids to water and then solidifying said mixture produces a solid ice structure, which is stronger and more thermally stable than pure water ice. Additionally, electrical properties of water ice may be modified through the addition of dielectric materials such as plastic powders. For example, the addition of wood particles in a concentration of 1% to 5% by volume can increase the impact shock resistance of ice to that of concrete. Such modified ice mixtures would be useful for treatments such as chemical-mechanical polishing, planarization and milling operations, among other high shear stress substrate surface treatments.

Although the preferred embodiments of the present invention have been shown and described, it should be understood that various modifications and rearrangements may be resorted to without departing from the scope of the invention as disclosed herein.

I claim:
1. An apparatus for spray cleaning a substrate comprising:
   an outer compartment having a bottom wall and side walls;
   an inner compartment defined by bottom and side walls contained within the outer compartment, the bottom wall of the inner compartment adjacent the bottom wall of the outer compartment and the side walls of the inner compartment spaced apart from the side walls of the outer compartment;
   at least one thermal electric cold plate disposed within the inner compartment, each thermal electric cold plate having a current reversible hot and cold side positioned opposite the bottom of the inner compartment;
   a thermally conductive base having a thermally conductive middle portion adjacent to and in thermal contact with each current reversible hot and cold side and separating a top of the inner compartment from the outer compartment, and opposing end portions extending from the middle portion between the outer compartment and inner compartment side walls towards the outer compartment bottom;
   a process fluid pipe for directing process fluid from a process fluid source into contact with the thermally conductive base and the substrate;
   a mounting device for securing the substrate when subjected to the process fluid, the mounting device connected to the outer compartment and positioned proximate the base; and
   a spray applicator for directing a cleaning spray at the substrate.
2. The apparatus of claim 1 and further comprising a fluid outlet port contained within the outer compartment.
3. The apparatus of claim 1 wherein the substrate is adherable to the base by solidifying the process fluid contacting the substrate and the base.
4. The apparatus of claim 1 and further comprising acoustic transducers for transmitting acoustic energy through the base substrate and create cavitation within the process fluid.
5. The apparatus of claim 1 wherein the base is grounded to dissipate electrostatic charges.
6. The apparatus of claim 1 wherein the base includes channels positioned therein for directing the fluid upon exiting the process fluid pipe.
7. The apparatus of claim 1 and further comprising a containment member supportable by the base, the substrate positionable therein.

* * * * *